(12) United States Patent
Hatase et al.

(10) Patent No.: US 12,432,858 B2
(45) Date of Patent: Sep. 30, 2025

(54) MODULE AND METHOD FOR MANUFACTURING SAME

(71) Applicant: Murata Manufacturing Co., Ltd., Nagaokakyo (JP)

(72) Inventors: Minoru Hatase, Nagaokakyo (JP); Yoshihito Otsubo, Nagaokakyo (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 239 days.

(21) Appl. No.: 17/934,328

(22) Filed: Sep. 22, 2022

(65) Prior Publication Data

US 2023/0013032 A1    Jan. 19, 2023

Related U.S. Application Data

(63) Continuation of application No. PCT/JP2021/005814, filed on Feb. 17, 2021.

(30) Foreign Application Priority Data

Mar. 27, 2020 (JP) .................. 2020-058303

(51) Int. Cl.
*H05K 1/18* (2006.01)
*H05K 1/09* (2006.01)
*H05K 3/02* (2006.01)
*H05K 3/28* (2006.01)
*H05K 3/30* (2006.01)

(52) U.S. Cl.
CPC ............. *H05K 1/183* (2013.01); *H05K 1/092* (2013.01); *H05K 3/02* (2013.01); *H05K 3/284* (2013.01);

(Continued)

(58) Field of Classification Search
CPC .......... H05K 1/183; H05K 1/092; H05K 3/02; H05K 3/284; H05K 3/301;

(Continued)

(56) References Cited

U.S. PATENT DOCUMENTS 7,339,278 B2 *  3/2008 Iksan .................. H01L 25/0657
                                                      257/E21.503
2004/0238603 A1    12/2004 Saito (Continued)

FOREIGN PATENT DOCUMENTS

JP        2004-356195 A     12/2004
JP        2006-185989 A      7/2006

(Continued)

OTHER PUBLICATIONS

International Search Report for PCT/JP2021/005814 dated Apr. 20, 2021.

*Primary Examiner* — Andargie M Aychillhum
(74) *Attorney, Agent, or Firm* — McDonald Hopkins LLC

(57) ABSTRACT

A module includes a substrate having a first surface and at least one recess on the first surface, and an electronic component mounted on the first surface. The electronic component is connected to the substrate via a plurality of bumps. All of the plurality of bumps are connected to the first surface inside any of the at least one recess. A height of the plurality of bumps is greater than a depth of the at least one recess. When viewed in a direction perpendicular to the first surface, a part of the electronic component is located outside an outer periphery of any recess selected from the at least one recess.

5 Claims, 13 Drawing Sheets

(52) U.S. Cl.
CPC ..... *H05K 3/301* (2013.01); *H05K 2201/0367* (2013.01); *H05K 2201/10371* (2013.01); *H05K 2203/1126* (2013.01); *H05K 2203/1147* (2013.01)

(58) Field of Classification Search
CPC . H05K 2201/0367; H05K 2201/10371; H05K 2203/1126; H05K 2203/1147
USPC ......................................................... 361/760
See application file for complete search history.

(56) References Cited

U.S. PATENT DOCUMENTS

| | | | |
|---|---|---|---|
| 2006/0067065 A1* | 3/2006 | My | H05K 3/3442 361/256 |
| 2010/0147573 A1 | 6/2010 | Fukuda | |
| 2010/0220448 A1 | 9/2010 | Nomura | |
| 2013/0075143 A1 | 3/2013 | Kasajima et al. | |
| 2017/0309807 A1 | 10/2017 | Kaneda | |
| 2019/0174627 A1* | 6/2019 | Matsushita | H05K 1/181 |
| 2020/0008301 A1 | 1/2020 | Kusuyama | |

FOREIGN PATENT DOCUMENTS

| | | | | |
|---|---|---|---|---|
| JP | 2007-142210 A | 6/2007 | | |
| JP | 4329884 B2 | 9/2009 | | |
| JP | 2009-267421 A | 11/2009 | | |
| JP | 2012-015172 A | 1/2012 | | |
| JP | 2013-074289 A | 4/2013 | | |
| JP | 6508217 B2 | 5/2019 | | |
| WO | WO-2013035716 A1 * | 3/2013 | ......... | H01L 21/4846 |
| WO | 2018/168709 A1 | 9/2018 | | |

* cited by examiner

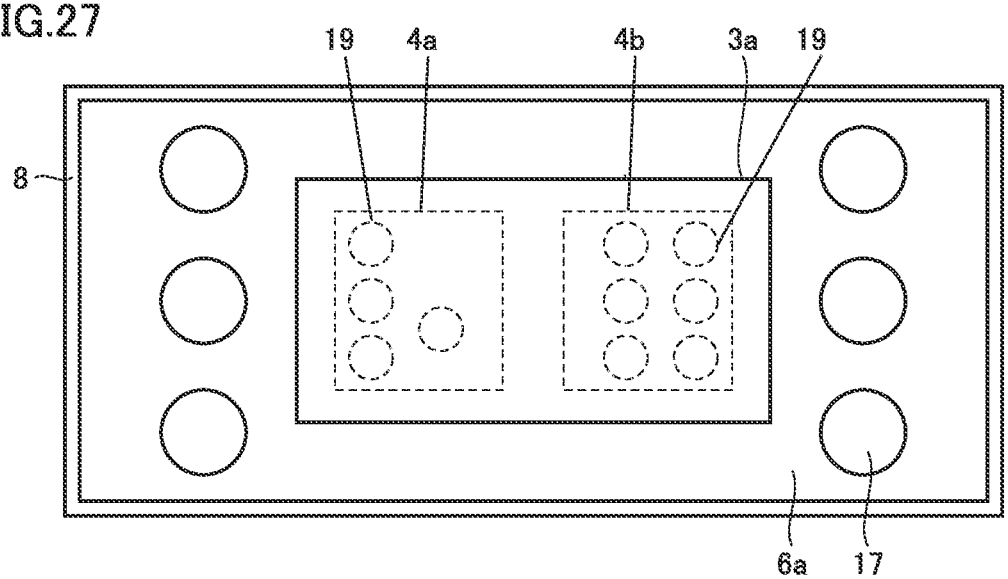
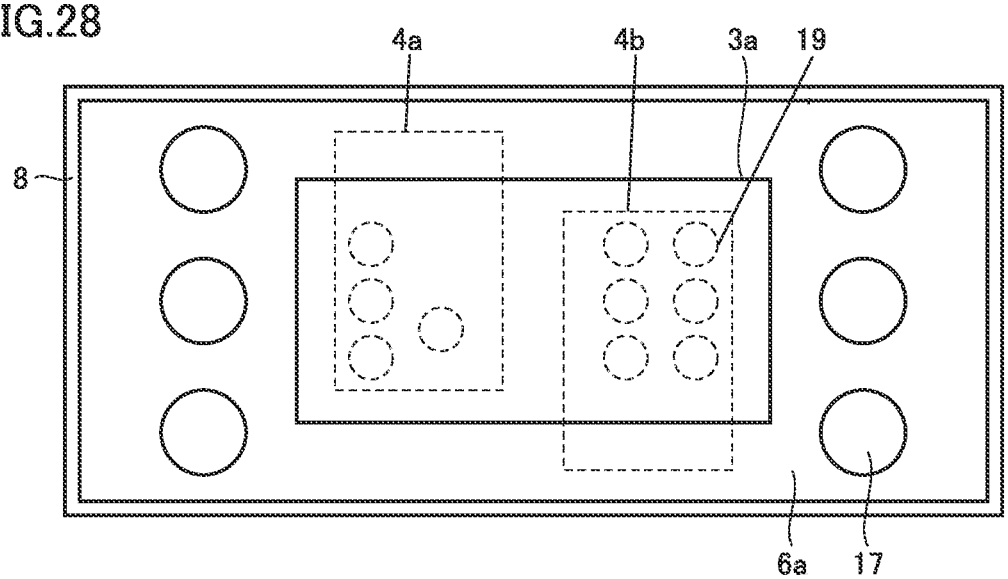

MODULE AND METHOD FOR MANUFACTURING SAME

CROSS REFERENCE TO RELATED APPLICATION

This is a continuation of International Application No. PCT/JP2021/005814 filed on Feb. 17, 2021 which claims priority from Japanese Patent Application No. 2020-058303 filed on Mar. 27, 2020. The contents of these applications are incorporated herein by reference in their entireties.

BACKGROUND OF THE DISCLOSURE

Field of the Disclosure

The present disclosure relates to a module and a method for manufacturing the same.

Description of the Related Art

Japanese Patent No. 6508217 (PTL 1) discloses an elastic surface wave device. In this device, a recess is formed on a first main surface of a substrate, and an elastic surface wave element is mounted on the first main surface. The elastic surface wave element is a type of electronic component.

PTL 1: Japanese Patent No. 6508217

BRIEF SUMMARY OF THE DISCLOSURE

In the structure disclosed in PTL 1, among a plurality of mounting electrodes included in the electronic component, some mounting electrodes are connected to the substrate inside the recess of the substrate, and some other mounting electrodes are connected to a region that is not the recess of the substrate. This brings the electronic component in its entirety into a state where the electronic component is connected using a region without a recess, so that the module is not made lower in profile in its entirety.

It is therefore an object of the present disclosure to provide a module and a method for manufacturing the same that can reduce the overall size of the module when viewed from above while making the module lower in profile.

In order to achieve the above-described object, a module according to the present disclosure includes a substrate having a first surface and at least one recess on the first surface, and an electronic component mounted on the first surface, the electronic component is connected to the substrate via a plurality of bumps, all of the plurality of bumps are connected to the first surface inside any of the at least one recess, a height of the plurality of bumps is greater than a depth of the at least one recess, and a part of the electronic component is located outside an outer periphery of any recess selected from the at least one recess when viewed in a direction perpendicular to the first surface.

According to the present disclosure, since all of the plurality of bumps are connected to the first surface 1a inside any of the at least one recess and a part of the electronic component is located outside the outer periphery of any recess, it is possible to reduce the overall size of the module when viewed from above while making the module lower in profile.

BRIEF DESCRIPTION OF THE SEVERAL VIEWS OF THE DRAWINGS

FIG. 27 is a bottom view of a module according to a third embodiment of the present disclosure.

FIG. 28 is a bottom view of a modification of the module according to the third embodiment of the present disclosure.

DETAILED DESCRIPTION OF THE DISCLOSURE

Figure 1:
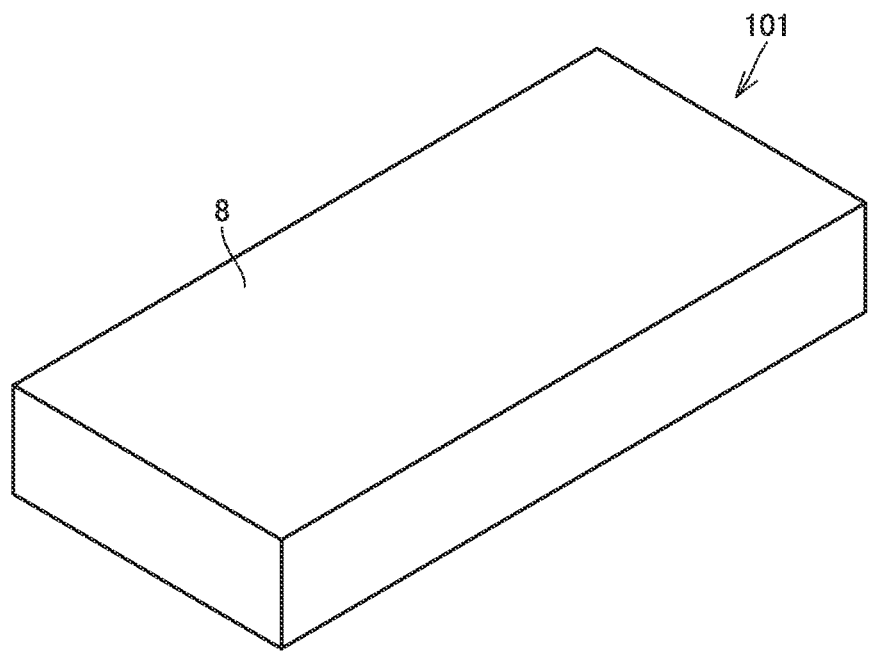
FIG. 1 is a first perspective view of a module according to a first embodiment of the present disclosure.

The dimensional ratios illustrated in the drawings do not necessarily represent the actual dimensional ratios, and the dimensional ratios may be exaggerated for convenience of description. In the following description, when referring to a superordinate or subordinate concept, it does not necessarily mean an absolute superordinate or subordinate, but may mean a relative superordinate or subordinate in the illustrated modes.

First Embodiment

Figure 2:
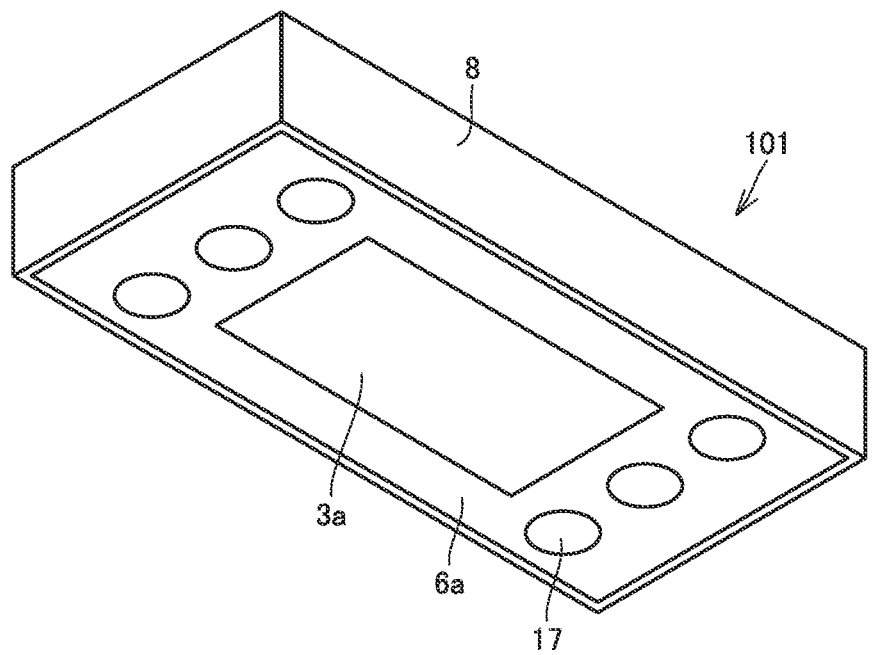
FIG. 2 is a second perspective view of the module according to the first embodiment of the present disclosure.
Figure 3:
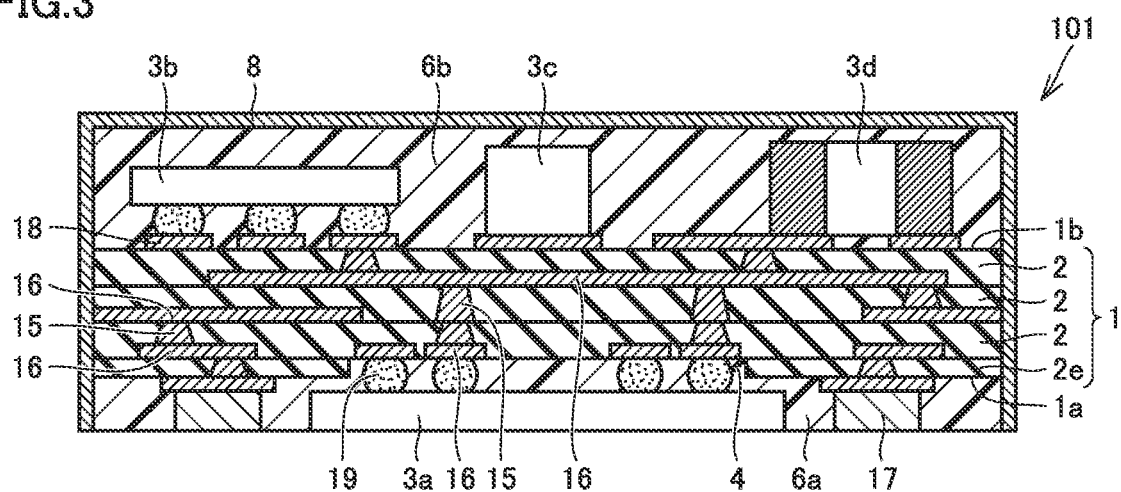
FIG. 3 is a cross-sectional view of the module according to the first embodiment of the present disclosure.

With reference to FIGS. 1 to 4, a module according to a first embodiment of the present disclosure will be described. FIG. 1 illustrates the appearance of a module 101 according to the present embodiment. An upper surface and a side surface of module 101 are covered with a shield film 8. FIG. 2 illustrates module 101 when viewed from obliquely below. A plurality of external terminals 17 are provided on a lower surface of module 101. An electronic component 3a is exposed from a center of the lower surface of module 101. A first sealing resin 6a is exposed from most of the other part of the lower surface of module 101. The configuration described above is merely an example, and is not taken by way of limitation. For example, rather than the configuration where first sealing resin 6a is directly exposed, a configuration where a region other than external terminals 17 is covered with any insulating film may be employed. A surface of each external terminal 17 exposed from the lower surface of module 101 may be covered with Ni/Au plating. The Ni/Au plating is formed by first applying plating with Ni and next applying plating with Au so as to cover the Ni layer. FIG. 3 is a cross-sectional view of module 101.

Module 101 includes a substrate 1. Substrate 1 has a first surface 1a and a second surface 1b. Substrate 1 is formed of a plurality of insulating layers 2 laminated into one unit. That is, substrate 1 may be a resin multilayer substrate or a ceramic multilayer substrate. Insulating layers 2, 2e may be resin layers or ceramic layers. Here, the description will be continued on the assumption that substrate 1 is a ceramic multilayer substrate. Although the boundary lines between insulating layers are displayed in the drawings, actually, in a state after sintering in a ceramic multilayer substrate, the stacked insulating layers will be integrated and the boundary lines between insulating layers will be vanished.

Module 101 according to the present embodiment includes substrate 1 having first surface 1a and at least one recess 4 on first surface 1a, and electronic component 3a mounted on first surface 1a. Here, an example where only one recess 4 is formed on first surface 1a has been illustrated, but is merely an example, and a plurality of recesses 4 may be formed on first surface 1a. First surface 1a is a concept including not only a flat surface other than recess 4 but also a side surface and a bottom surface of recess 4.

Electronic component 3a is mounted on substrate 1 via a plurality of bumps 19. Module 101 includes electronic components 3b, 3c, 3d mounted on second surface 1b. A pad electrode 18 is formed on second surface 1b of substrate 1. Electronic components 3b, 3c, 3d are mounted using pad electrode 18. Some conductor patterns 16 are disposed inside substrate 1. A conductor via 15 is disposed so as to extend through insulating layers 2, 2e. Conductor via 15 may be disposed so as to connect conductor patterns 16. Otherwise, conductor via 15 may be disposed so as to connect conductor pattern 16 and pad electrode 18.

Figure 4:
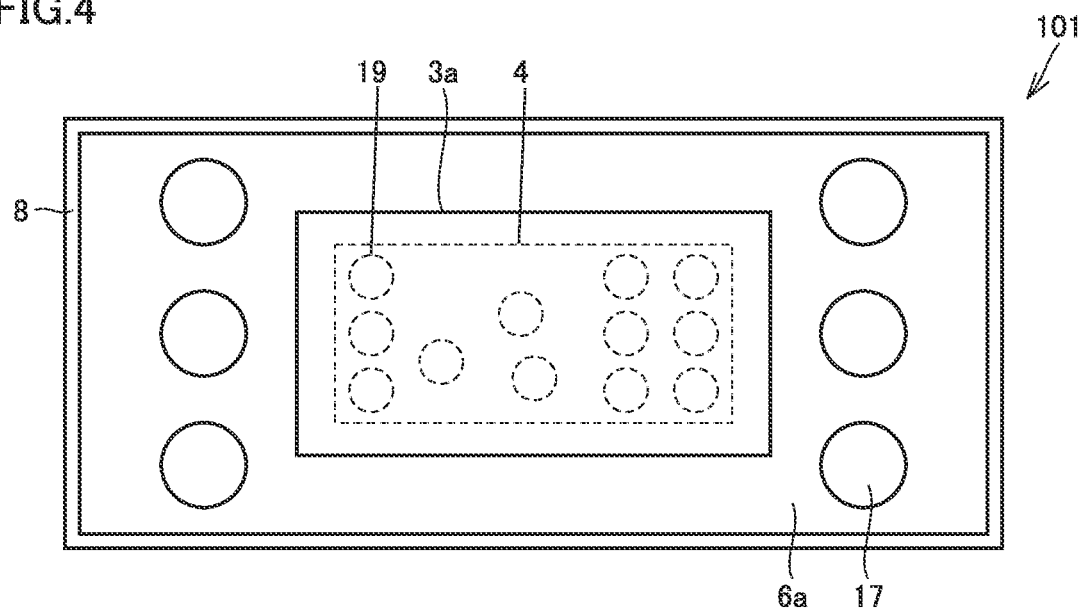
FIG. 4 is a bottom view of the module according to the first embodiment of the present disclosure.

FIG. 4 is a bottom view of module 101. In FIG. 4, recess 4 and bumps 19 are hidden on the other side of electronic component 3a, so that recess 4 and bumps 19 are indicated by dashed lines. In module 101, all of the plurality of bumps 19 are connected to first surface 1a inside any of the at least one recess 4. In the example illustrated here, first surface 1a has only one recess 4, so that all bumps 19 are accommodated inside the one recess 4. As illustrated in FIG. 3, a height of the plurality of bumps 19 is greater than a depth of the at least one recess 4. As illustrated in FIG. 4, when viewed in a direction perpendicular to first surface 1a, a part of electronic component 3a is located outside an outer periphery of any recess selected from the at least one recess 4. That is, a part of electronic component 3a extends outside recess 4. In the example illustrated in FIG. 4, electronic component 3a extends outside all four sides of recess 4. FIG. 3 also illustrates electronic component 3a laterally extending outside recess 4.

In the present embodiment, all of the plurality of bumps 19 are connected to first surface 1a inside any of the at least one recess 4, so that it is possible to make the module lower in profile in its entirety by the depth of recess 4.

Further, the height of the plurality of bumps 19 is greater than the depth of the at least one recess 4, so that even with recess 4 smaller than electronic component 3a when viewed in the direction perpendicular to first surface 1a, substrate 1 and electronic component 3a are prevented from coming into contact with each other. This allows a part of electronic component 3a to be disposed outside the outer periphery of any recess selected from the at least one recess 4. That is, ends of recess 4 can be disposed so as to be hidden below electronic component 3a. This allows an electrode or the like that needs to be disposed outside recess 4 in substrate 1 to be disposed inward as compared with a conventional case, and as a result, the module can be downsized.

Furthermore, in the present embodiment, all of the plurality of bumps 19 are located inside recess 4, so that when another component is mounted on first surface 1a, a short circuit between electronic component 3a and the other component can be prevented.

As described above, in the present embodiment, it is possible to reduce the overall size of the module when viewed from above while making the module lower in profile.

Figure 5:
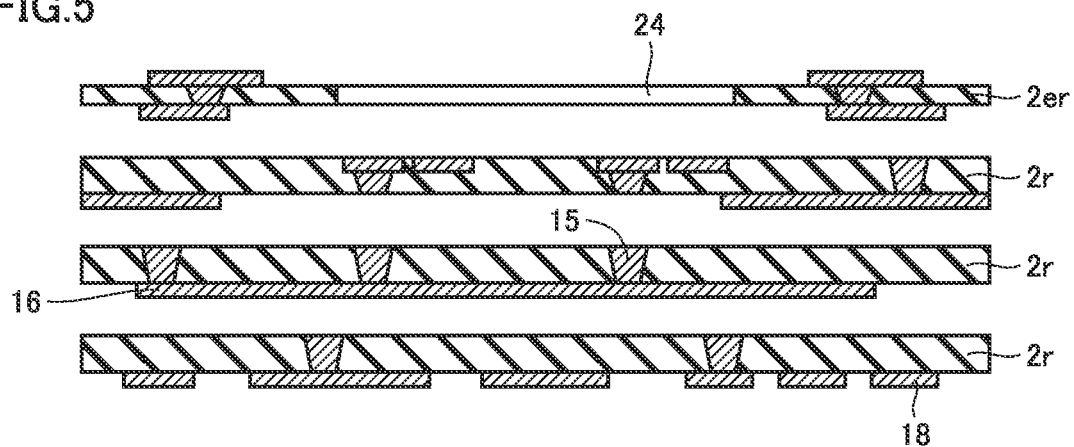
FIG. 5 is a first diagram for describing a method for manufacturing the module according to the first embodiment of the present disclosure.
Figure 6:
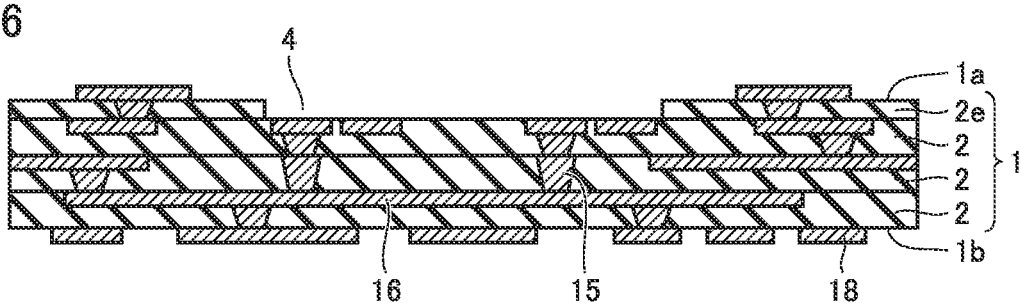
FIG. 6 is a second diagram for describing the method for manufacturing the module according to the first embodiment of the present disclosure.

With reference to FIGS. 5 to 10, a method for manufacturing module 101 according to the present embodiment will be described. First, as illustrated in FIG. 5, a plurality of ceramic green sheets 2r and one ceramic green sheet 2er are prepared. Ceramic green sheet 2er has an opening 24. Ceramic green sheet 2er is thinner than ceramic green sheets 2r. Conductor pattern 16 and conductor via 15 are formed in each of ceramic green sheets 2r, 2er as necessary. Laminating the plurality of ceramic green sheets 2r, 2er forms recess 4 as illustrated in FIG. 6.

Figure 7:
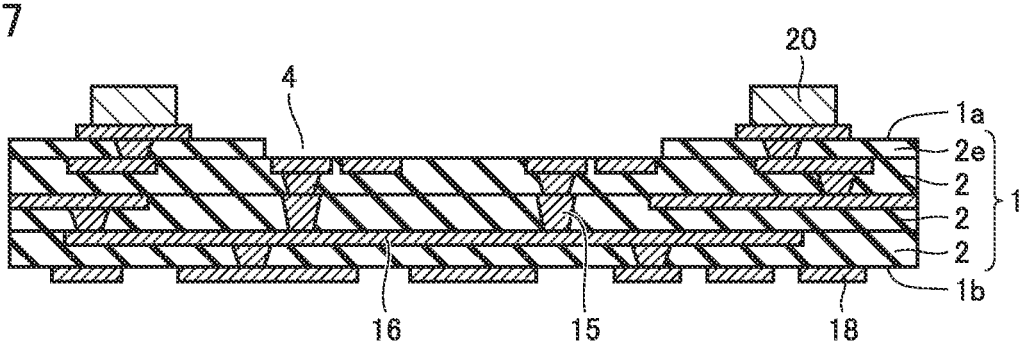
FIG. 7 is a third diagram for describing the method for manufacturing the module according to the first embodiment of the present disclosure.

As illustrated in FIG. 7, a post electrode 20 is formed. Post electrode 20 can be formed using a constraining layer (not illustrated). After the constraining layer is disposed and post electrode 20 is formed by, for example, filling a through hole provided in the constraining layer with a conductive paste, the constraining layer is removed. Alternatively, post electrode 20 may be formed by installing a metal block, a metal pin, or the like.

Figure 8:
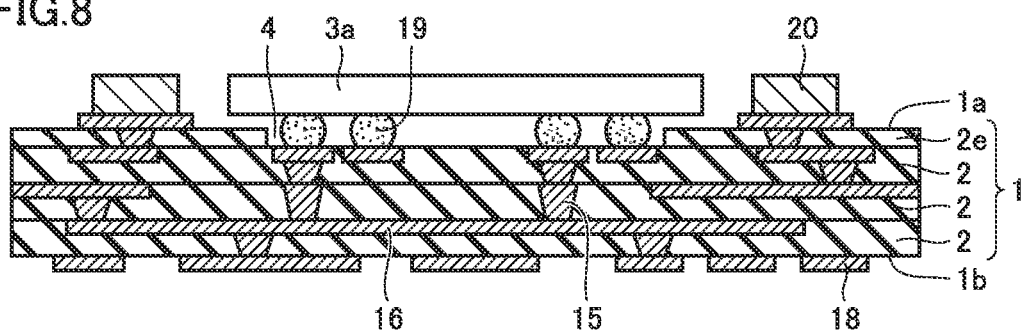
FIG. 8 is a fourth diagram for describing the method for manufacturing the module according to the first embodiment of the present disclosure.

As illustrated in FIG. 8, electronic component 3a is mounted. Electronic component 3a is mounted via bumps 19. Bumps 19 are connected to first surface 1a in recess 4. A part of electronic component 3a is located outside the outer periphery of recess 4. That is, electronic component 3a laterally extends outside recess 4.

Figure 9:
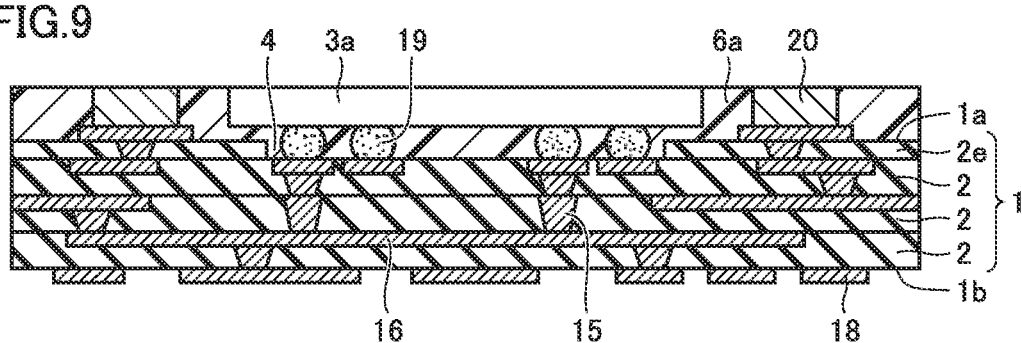
FIG. 9 is a fifth diagram for describing the method for manufacturing the module according to the first embodiment of the present disclosure.

As illustrated in FIG. 9, first sealing resin 6a is formed. First sealing resin 6a can be formed by molding. After first sealing resin 6a is once formed so as to cover electronic component 3a, post electrode 20, and first surface 1a, a surface of first sealing resin 6a may be ground to expose an upper surface of post electrode 20. A part of electronic component 3a may be removed by this grinding. A surface of electronic component 3a may be exposed from first sealing resin 6a. A necessary conductive film is formed on the upper surface of post electrode 20 by printing, plating, or the like. As a result, external terminal 17 (see FIG. 3) is formed.

Figure 10:
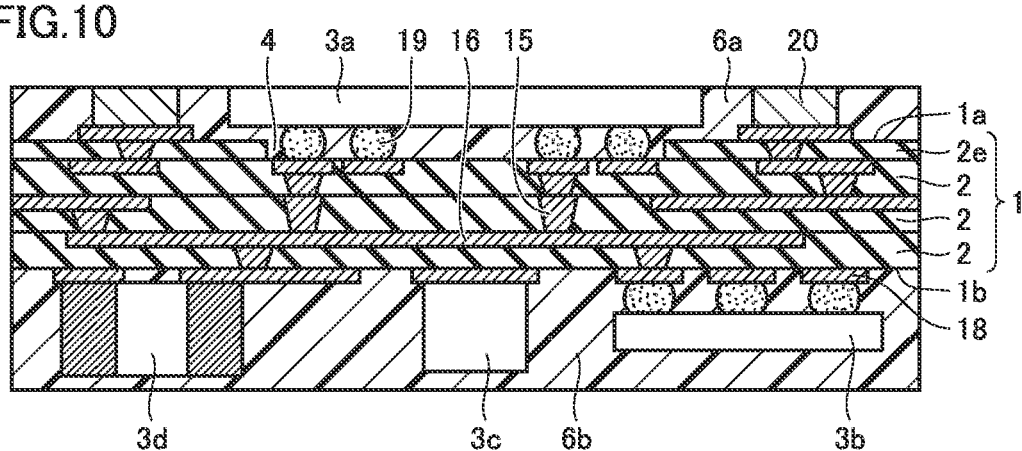
FIG. 10 is a sixth diagram for describing the method for manufacturing the module according to the first embodiment of the present disclosure.

As illustrated in FIG. 10, electronic components 3b, 3c, 3d are mounted on second surface 1b of substrate 1. A second sealing resin 6b is disposed so as to cover electronic components 3b, 3c, 3d and second surface 1b.

Subsequently, when shield film 8 is formed, and the module is turned upside down, module 101 according to the present embodiment as illustrated in FIG. 3 is obtained.

Under the manufacturing method described above, in order to form recess 4, laminating is performed with ceramic green sheet 2er having opening 24 contained, but the method for forming recess 4 is not limited to such a method. Other methods are also applicable to the formation of recess 4. An example of the other methods will be described with reference to FIGS. 11 to 19.

Figure 11:
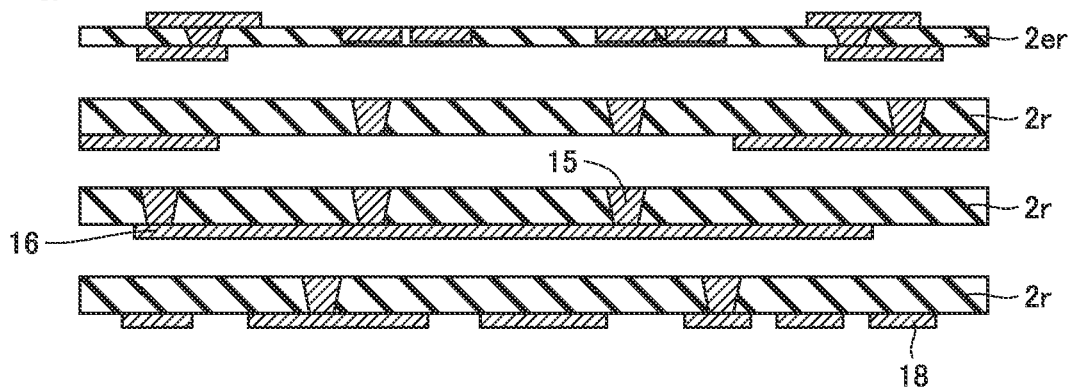
FIG. 11 is a first diagram for describing a method for manufacturing a modification of the module according to the first embodiment of the present disclosure.

First, as illustrated in FIG. 11, the plurality of ceramic green sheets 2r and one ceramic green sheet 2er are prepared. Ceramic green sheet 2er is thinner than ceramic green sheets 2r. Here, a configuration where ceramic green sheet 2er corresponding to a surface layer is thinner than ceramic green sheets 2r has been described as an example, but the configuration is not taken by way of limitation, and ceramic green sheet 2er may be approximately identical in thickness to ceramic green sheets 2r, for example. Alternatively, ceramic green sheet 2er may be thicker than ceramic green sheets 2r.

Conductor pattern 16 and conductor via 15 are formed in each of ceramic green sheets 2r, 2er as necessary. Conductor via 15 is formed by filling, with a conductive paste, a through hole formed in each ceramic green sheet by laser processing or the like. Conductor pattern 16 and pad electrode 18 may be formed by, for example, printing a conductive paste.

Figure 12:
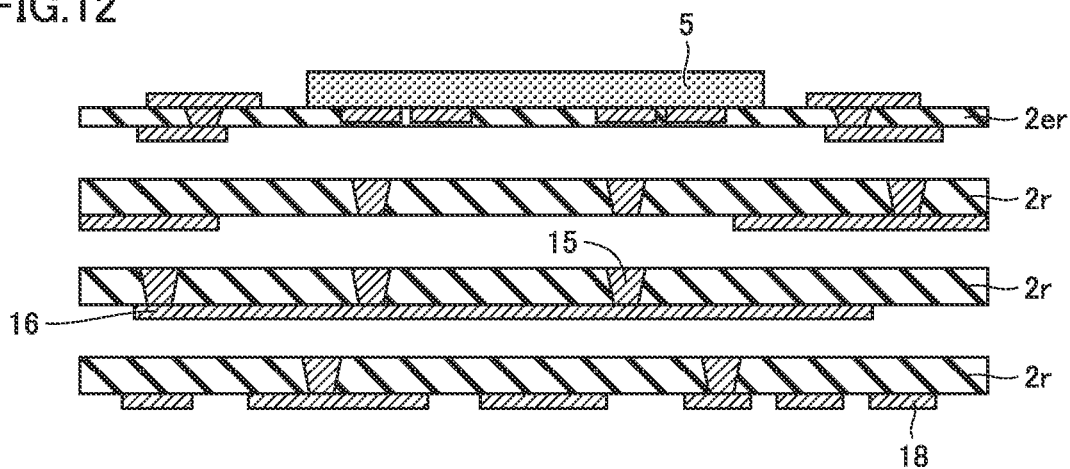
FIG. 12 is a second diagram for describing the method for manufacturing the modification of the module according to the first embodiment of the present disclosure.
Figure 13:
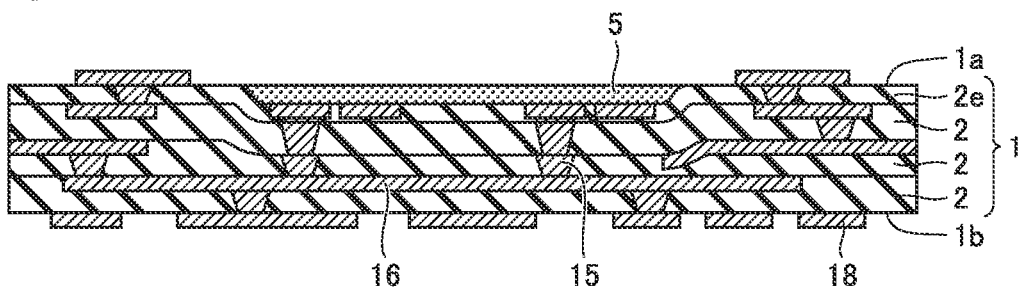
FIG. 13 is a third diagram for describing the method for manufacturing the modification of the module according to the first embodiment of the present disclosure.
Figure 14:
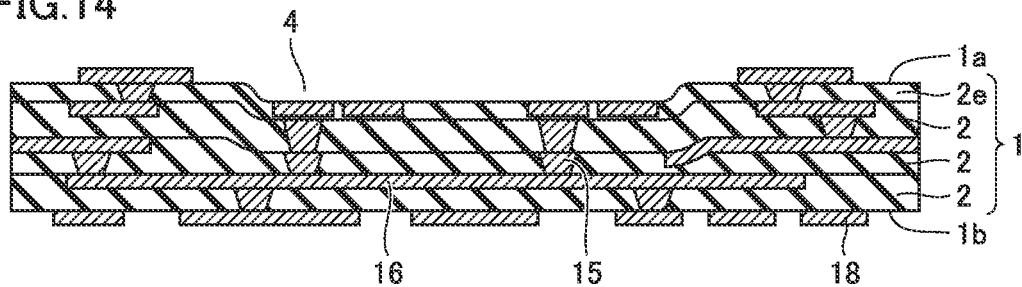
FIG. 14 is a fourth diagram for describing the method for manufacturing the modification of the module according to the first embodiment of the present disclosure.

As illustrated in FIG. 12, a paste layer 5 is formed on a surface of ceramic green sheet 2er by a method such as printing. Paste layer 5 is made of, for example, an alumina paste. In this state, first surface 1a of substrate 1 is pressed together with paste layer 5 by a member having a flat surface. This pressing causes, as illustrated in FIG. 13, paste layer 5 to sink into substrate 1. Subsequently, paste layer 5 is removed. As a result, recess 4 is obtained as illustrated in FIG. 14.

Figure 15:
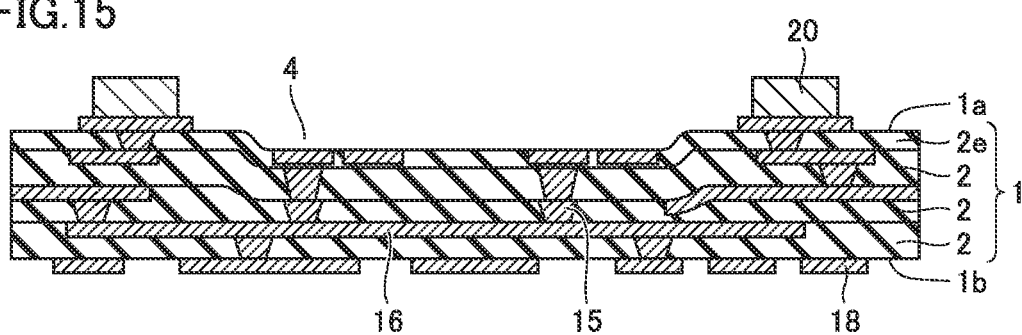
FIG. 15 is a fifth diagram for describing the method for manufacturing the modification of the module according to the first embodiment of the present disclosure.
Figure 16:
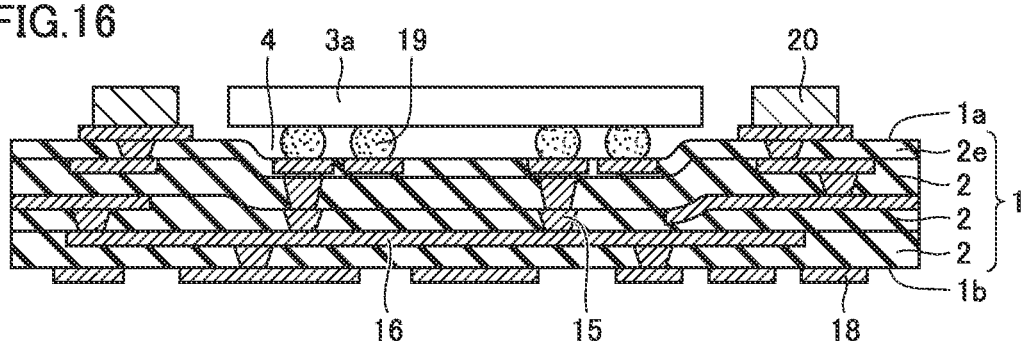
FIG. 16 is a sixth diagram for describing the method for manufacturing the modification of the module according to the first embodiment of the present disclosure.
Figure 17:
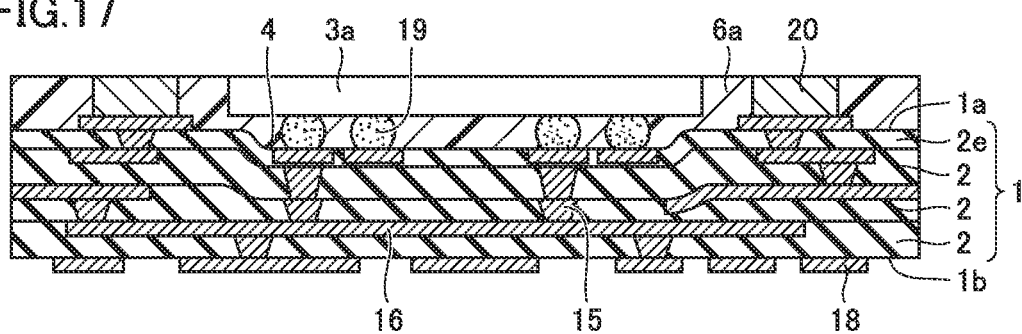
FIG. 17 is a seventh diagram for describing the method for manufacturing the modification of the module according to the first embodiment of the present disclosure.
Figure 18:
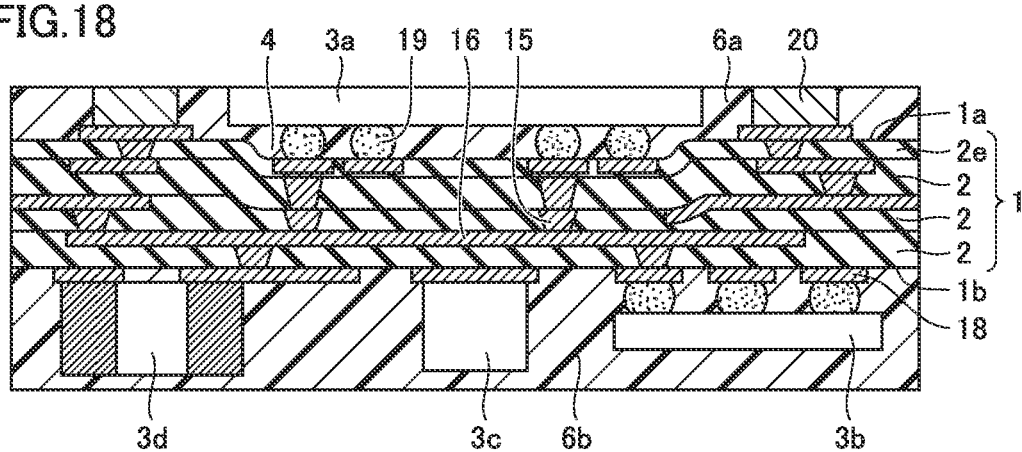
FIG. 18 is an eighth diagram for describing the method for manufacturing the modification of the module according to the first embodiment of the present disclosure.
Figure 19:
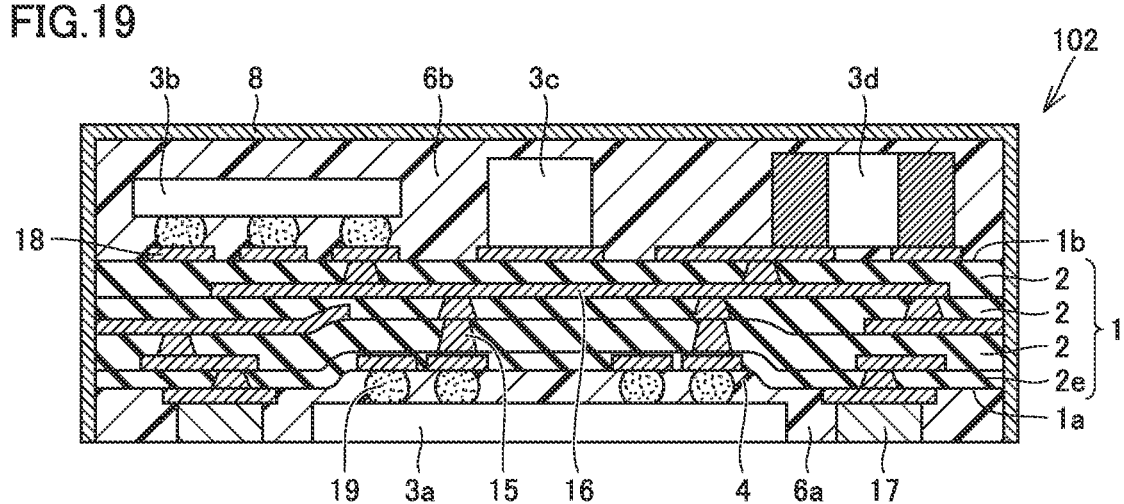
FIG. 19 is a cross-sectional view of the modification of the module according to the first embodiment of the present disclosure.

As illustrated in FIG. 15, post electrode 20 is formed. A method for forming post electrode 20 is as described above. As illustrated in FIG. 16, electronic component 3a is mounted. As illustrated in FIG. 17, first sealing resin 6a is formed. As illustrated in FIG. 18, electronic components 3b, 3c, 3d are mounted on second surface 1b of substrate 1. Second sealing resin 6b is disposed so as to cover electronic components 3b, 3c, 3d and second surface 1b. Furthermore, when shield film 8 is formed, and the module is turned upside down, a module 102 as illustrated in FIG. 19 is obtained.

The method for manufacturing the module described above can be expressed as follows. The method for manufacturing the module includes obtaining a multilayer body having a first surface by laminating a plurality of ceramic green sheets, forming an alumina paste layer, by printing, on a partial region of the first surface, pressing the first surface together with the alumina paste layer, thereby pressing the alumina paste layer into the first surface, forming a recess on the first surface by removing the alumina paste layer, firing the multilayer body after the forming a recess, preparing an electronic component, and mounting, after the firing the multilayer body, the electronic component via a plurality of bumps so as to cause all of the plurality of bumps to be accommodated inside the recess and a part of the electronic component to be located outside an outer periphery of the recess when viewed in a direction perpendicular to the first surface, and to cause the plurality of bumps to be connected to the first surface.

Figure 20:
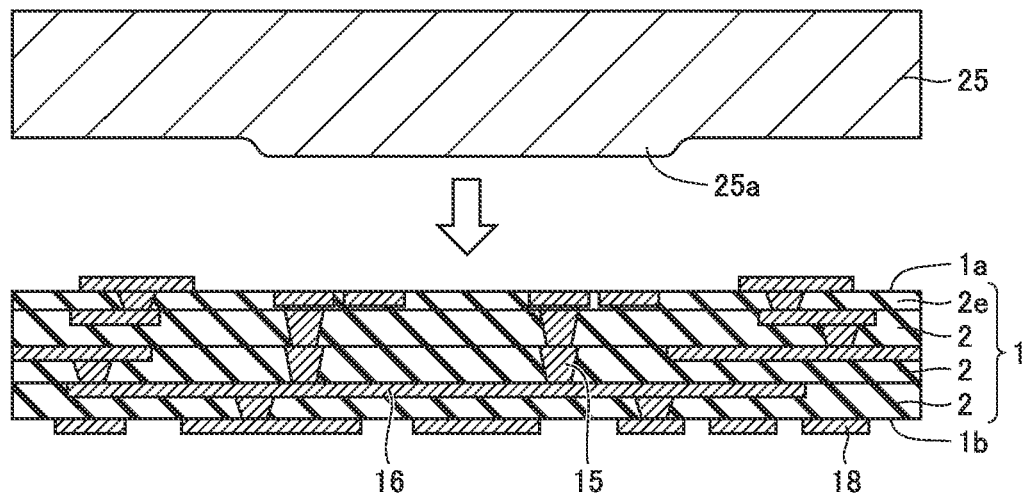
FIG. 20 is a diagram for describing another method for manufacturing the module according to the first embodiment of the present disclosure.

As illustrated in FIG. 20, the recess may be formed by pressing using a die 25. Here, substrate 1 illustrated in FIG. 11 is pressed using die 25. Die 25 illustrated in FIG. 20 includes a protrusion 25a. A shape of protrusion 25a corresponds to a shape of recess 4. Under this method, recess 4 can be formed on first surface 1a as illustrated in FIG. 14.

Second Embodiment

With reference to FIGS. 21 to 25, a module according to a second embodiment of the present disclosure will be described. The basic configuration of the module according to the present embodiment is the same as described in the first embodiment, so that no description of the basic configuration will be given below. The module according to the present embodiment further includes the following configuration.

Figure 21:
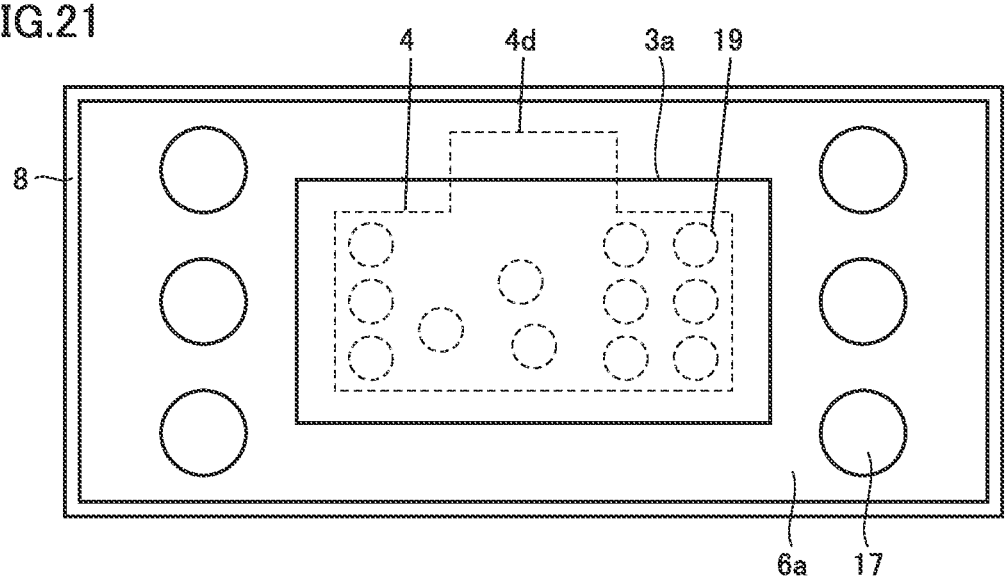
FIG. 21 is a bottom view of a module according to a second embodiment of the present disclosure.

In the module according to the present embodiment, when viewed in a direction perpendicular to first surface 1a as illustrated in FIG. 21, a part of at least one recess 4 is located outside the outer periphery of electronic component 3a. In the example illustrated in FIG. 21, recess 4 includes a projecting part 4d in the middle of one side. Projecting part 4d is located outside the outer periphery of electronic component 3a.

The present embodiment can produce the same effects as the effects of the first embodiment. Furthermore, in the present embodiment, the part of recess 4 extending outside electronic component 3a can serve as an inlet for sealing resin to flow into a back side of electronic component 3a when the sealing resin is injected to form first sealing resin 6a. Therefore, the back side of electronic component 3a can be satisfactorily filled with first sealing resin 6a. Some modifications will be described below.

Figure 22:
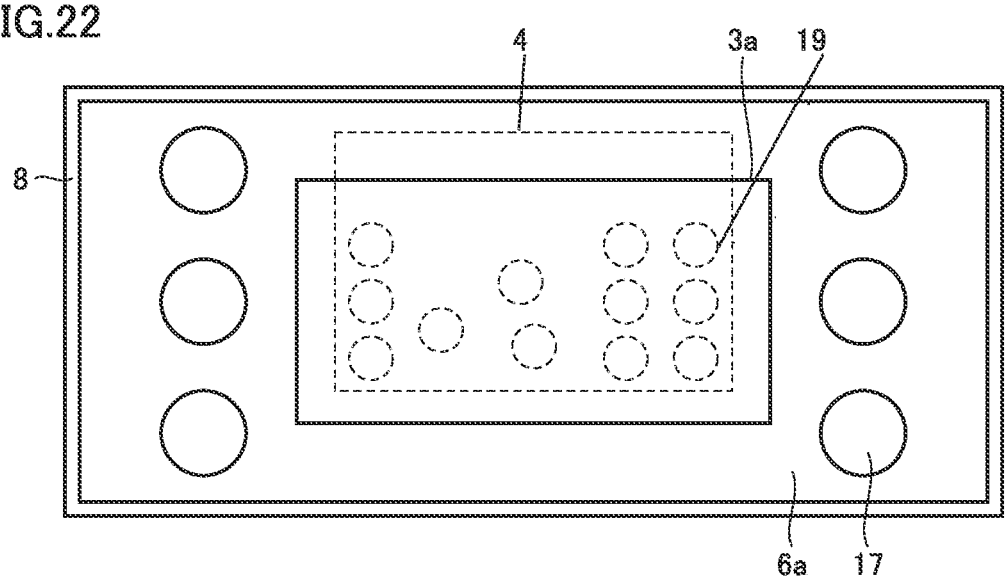
FIG. 22 is a bottom view of a first modification of the module according to the second embodiment of the present disclosure.

In the example illustrated in FIG. 22, recess 4 extends outside electronic component 3a over one side of recess 4.

Figure 23:
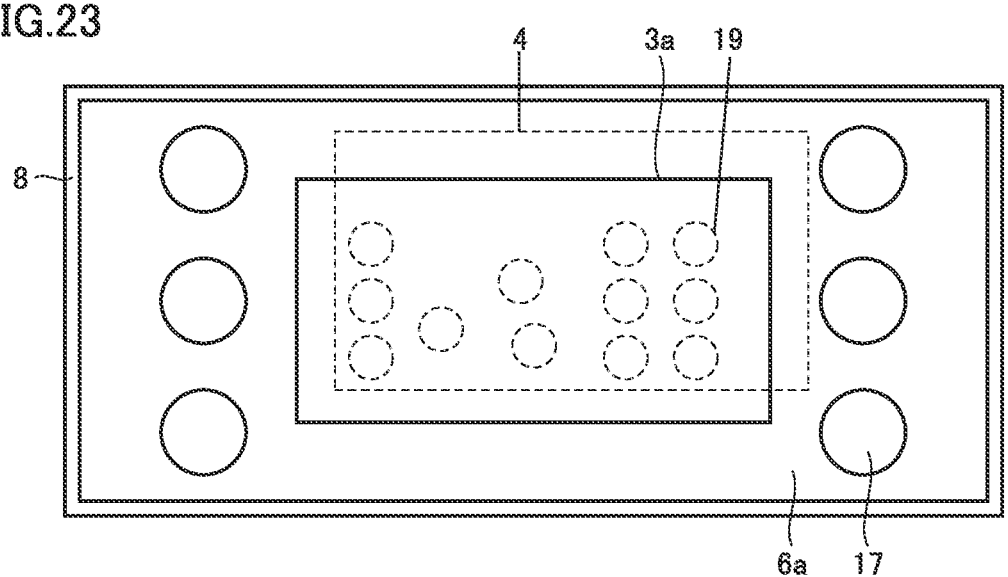
FIG. 23 is a bottom view of a second modification of the module according to the second embodiment of the present disclosure.

In the example illustrated in FIG. 23, recess 4 extends outside electronic component 3a over two sides of recess 4 forming an L shape.

Figure 24:
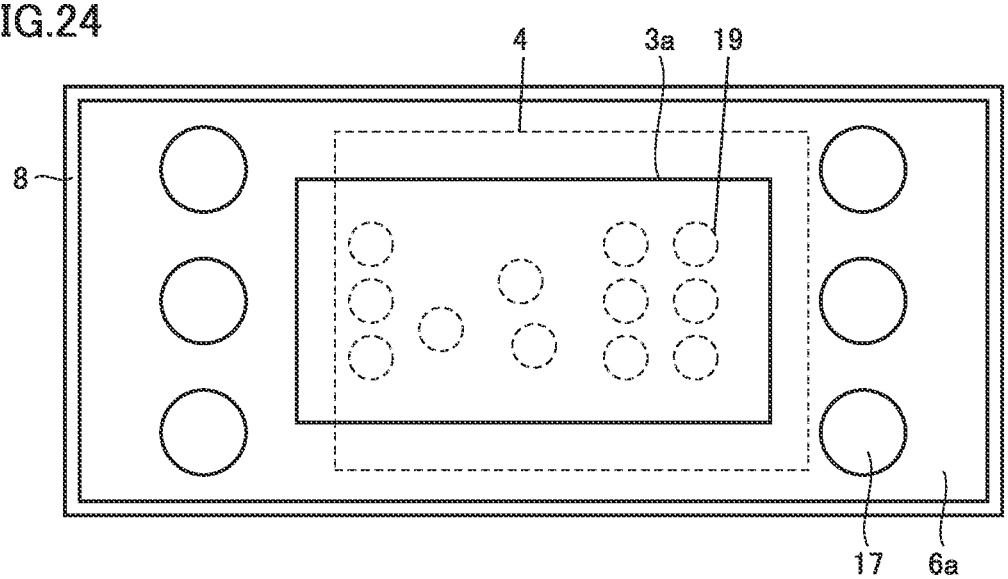
FIG. 24 is a bottom view of a third modification of the module according to the second embodiment of the present disclosure.

In the example illustrated in FIG. 24, recess 4 extends outside electronic component 3a over three of the four sides of recess 4.

Figure 25:
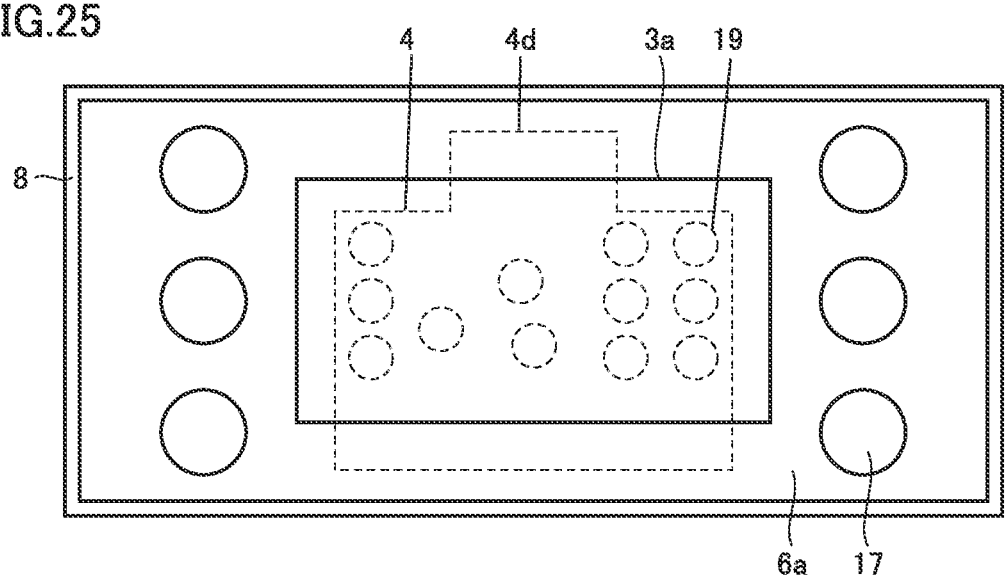
FIG. 25 is a bottom view of a fourth modification of the module according to the second embodiment of the present disclosure.

In the example illustrated in FIG. 25, recess 4 extends outside electronic component 3a due to the presence of projecting part 4d in the middle of one side, and recess 4 extends outside electronic component 3a over a side on an opposite side of recess 4.

Figure 26:
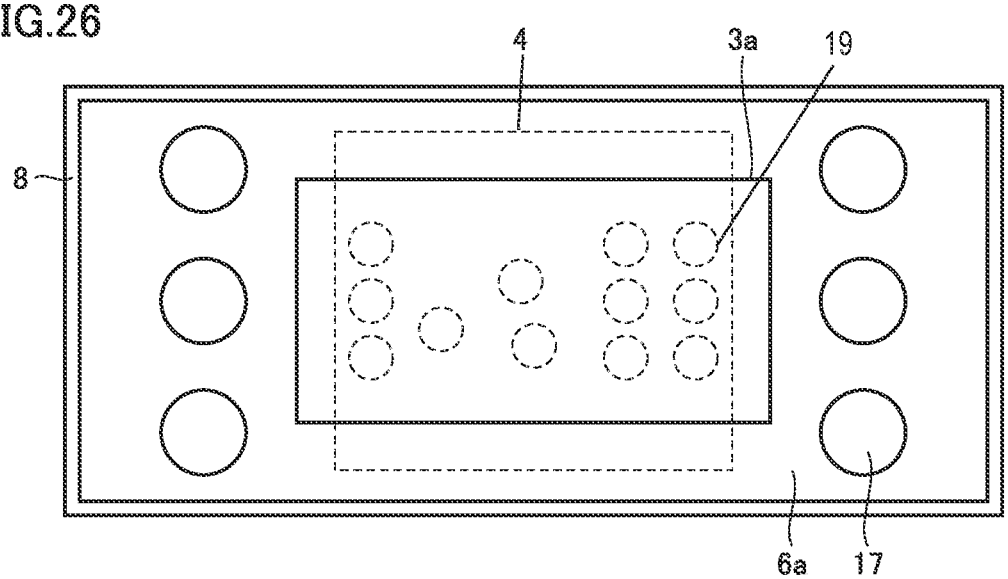
FIG. 26 is a bottom view of a fifth modification of the module according to the second embodiment of the present disclosure.

When attention is paid to one recess of the at least one recess, the one recess preferably includes a part located outside the electronic component relative to two sides, on opposites sides, of the electronic component when viewed in a direction perpendicular to the first surface. That is, the one recess preferably extends outside the electronic component relative to two sides on opposite sides of the electronic component. With this configuration, an inflow port for first sealing resin 6a is present on two sides on opposites sides, and the sealing resin can be more smoothly injected into the back side of electronic component 3a at the time of forming first sealing resin 6a. The examples illustrated in FIGS. 24 and 25 satisfy this condition. Further, a configuration as illustrated in FIG. 26 may be employed. A distance between an outline of the electronic component and an outline of the recess in the part, where the outline of the electronic component is located outside the outline of the recess, is preferably 20 μm or more and 500 μm or less. More preferably, a distance between an outline of the electronic component and an outline of the recess in the part, where the outline of the electronic component is located outside the outline of the recess, is 30 μm or more and 80 μm or less.

Third Embodiment

With reference to FIG. 27, a module according to a third embodiment of the present disclosure will be described. The basic configuration of the module according to the present embodiment is the same as described in the first embodiment, so that no description of the basic configuration will be given below. The module according to the present embodiment further includes the following configuration.

In the module according to the present embodiment, as illustrated in FIG. 27, first surface 1a has a plurality of recesses 4a, 4b, and the plurality of bumps 19 are divided into a plurality of groups, and each group is connected to a corresponding one of the plurality of recesses 4a, 4b. Here, two recesses 4a, 4b are illustrated as examples of the "plurality of recesses", but the number of recesses may be greater than or equal to three.

The present embodiment can produce the same effects as the effects of the first embodiment. Furthermore, in the present embodiment, a probability of a short circuit between bumps of one electronic component that are separately located at a plurality of recesses can be reduced. In order to mount the bumps of one electronic component, a recess may be provided separately for each necessary portion, so that an area of a portion other than the recess of first surface 1a can be increased, and as a result, a degree of freedom in design can be increased.

As illustrated in FIG. 28, a part of each of the plurality of recesses 4a, 4b may extend outside electronic component 3a. This configuration allows the sealing resin to smoothly flow into the back side of electronic component 3a.

Fourth Embodiment

Figure 29:
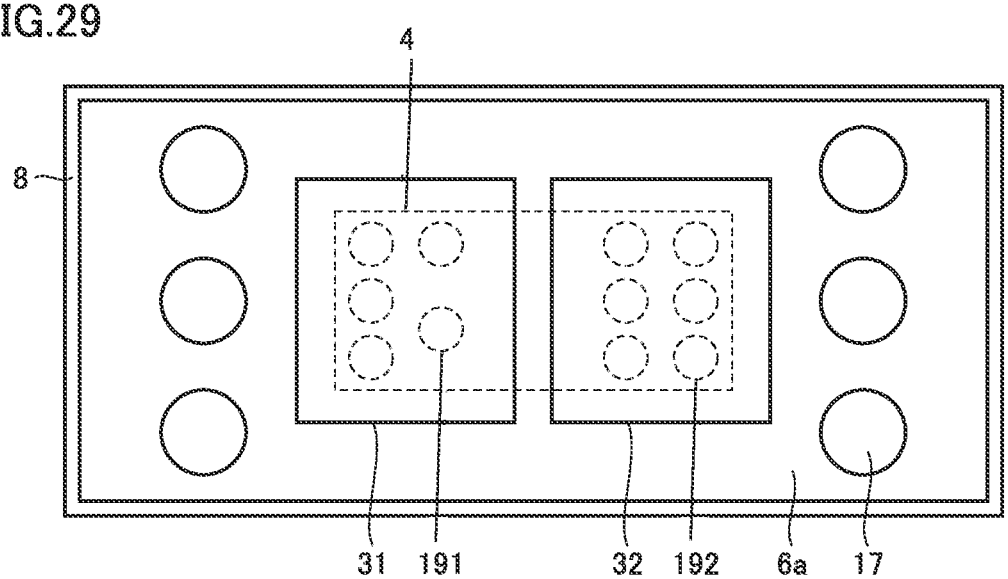
FIG. 29 is a bottom view of a module according to a fourth embodiment of the present disclosure.

With reference to FIG. 29, a module according to a fourth embodiment of the present disclosure will be described. The basic configuration of the module according to the present embodiment is the same as described in the first embodiment, so that no description of the basic configuration will be given below. The module according to the present embodiment includes a plurality of electronic components 31, 32. Electronic component 31 is mounted via a plurality of bumps 191. Electronic component 32 is mounted via a plurality of bumps 192. The module according to the present embodiment has one recess 4 on first surface 1a of substrate 1. The plurality of bumps 191 and the plurality of bumps 192 are both disposed inside recess 4. Recess 4 is disposed extending over electronic components 31, 32. Such a configuration may be employed.

The present embodiment can produce the same effects as the effects of the first embodiment. Furthermore, in the present embodiment, the number of recesses can be made smaller than the number of electronic components, so that manufacturing is made easier.

Figure 30:
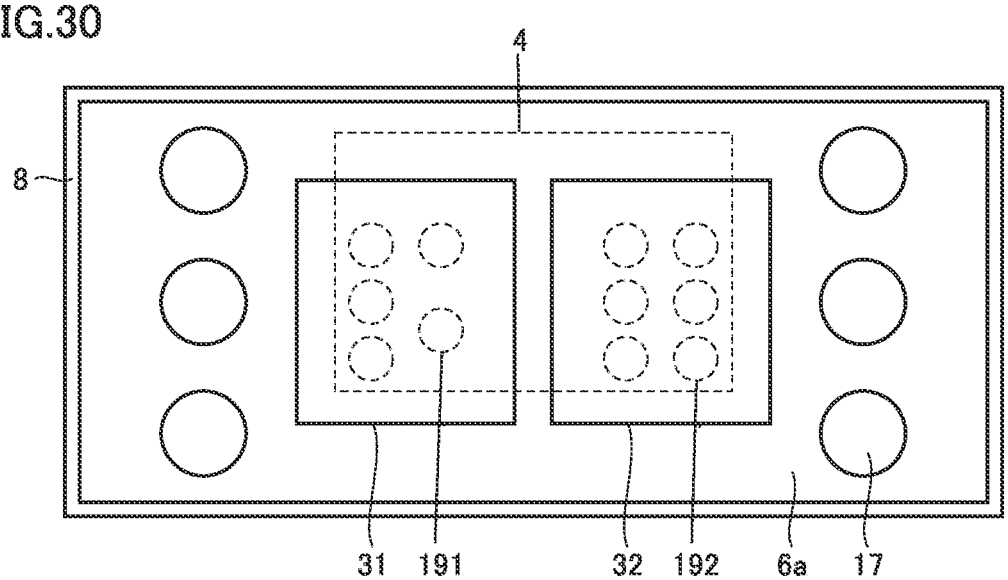
FIG. 30 is a bottom view of a modification of the module according to the fourth embodiment of the present disclosure.

As a modification, an example as illustrated in FIG. 30 may be employed. In this example, a part of one common recess 4 corresponding to a plurality of electronic components extend outside electronic components 31, 32.

Note that, in each of the above-described embodiments, the electronic component is rectangular when viewed from directly above, but the electronic component may have a different shape.

In any of the embodiments described above, the module may include a sealing resin disposed so as to cover the electronic component, and shield film 8 that covers the sealing resin and further covers a side surface of substrate 1.

As described in the above-described embodiments, substrate 1 may have second surface 1b as a surface opposite from first surface 1a, and an electronic component different from the electronic component may be mounted on second surface 1b.

Note that a combination of some of the embodiments may be employed as needed.

Note that the embodiments disclosed herein are illustrative in all respects and are not restrictive. The scope of the present disclosure is set forth by the claims, and the present disclosure is intended to include the claims, equivalents of the claims, and all modifications within the scope.

1: substrate, 1a: first surface, 1b: second surface, 2, 2e: insulating layer, 2r, 2er: ceramic green sheet, 3a, 3b, 3c, 3d, 31, 32: electronic component, 4: recess, 4d: projecting part, 5: paste layer, 6a: first sealing resin, 6b: second sealing resin, 8: shield film, 15: conductor via, 16: conductor pattern, 17: external terminal, 18: pad electrode, 19, 191, 192: bump, 20: post electrode, 24: opening, 25: die, 25a: protrusion, 101, 102: module

The invention claimed is:

1. A module comprising:
   a substrate having a first surface and at least one recess on the first surface; and
   an electronic component mounted on the first surface, wherein
   the electronic component is connected to the substrate via a plurality of bumps,
   all of the plurality of bumps are connected to the first surface inside any of the at least one recess, a height of each of the plurality of bumps is greater than a depth of the at least one recess, a part of the electronic component is located outside an outer periphery of any recess selected from the at least one recess when viewed in a direction perpendicular to the first surface, and two or more bumps selected from the plurality of bumps are connected to the first surface in one recess selected from the at least one recess.

2. The module according to claim 1, further comprising:
a sealing resin disposed so as to cover the electronic component; and
a shield film covering the sealing resin and further covering a side surface of the substrate.

3. The module according to claim 1, wherein the substrate has a second surface as a surface opposite from the first surface, and another electronic component different from the electronic component is mounted on the second surface.

4. The module according to claim 1, wherein a distance between an outline of the electronic component and an outline of the recess in the part, where the outline of the electronic component is located outside the outline of the recess, is 20 μm or more and 500 μm or less.

5. The module according to claim 4, wherein a distance between an outline of the electronic component and an outline of the recess in the part, where the outline of the electronic component is located outside the outline of the recess, is 30 μm or more and 80 μm or less.

* * * * *